(12) United States Patent
Sasaki et al.

(10) Patent No.: US 10,321,616 B2
(45) Date of Patent: Jun. 11, 2019

(54) ELECTRONIC APPARATUS

(71) Applicant: Sony Interactive Entertainment Inc., Tokyo (JP)

(72) Inventors: Ichiro Sasaki, Chiba (JP); Keiichi Aoki, Tokyo (JP)

(73) Assignee: Sony Interactive Entertainment Inc., Tokyo (JP)

( * ) Notice: Subject to any disclaimer, the term of this patent is extended or adjusted under 35 U.S.C. 154(b) by 0 days.

(21) Appl. No.: 15/663,098

(22) Filed: Jul. 28, 2017

(65) Prior Publication Data

US 2018/0042148 A1 Feb. 8, 2018

(30) Foreign Application Priority Data

Aug. 2, 2016 (JP) .................................. 2016-152223

(51) Int. Cl.
*H05K 9/00* (2006.01)
*H05K 1/18* (2006.01)
*H05K 5/02* (2006.01)

(52) U.S. Cl.
CPC ........... *H05K 9/0024* (2013.01); *H05K 1/181* (2013.01); *H05K 5/0247* (2013.01); *H05K 2201/10356* (2013.01); *H05K 2201/10371* (2013.01); *H05K 2201/10393* (2013.01); *H05K 2201/10409* (2013.01)

(58) Field of Classification Search
CPC ................. H05K 9/0024; H05K 1/181; H05K 2201/10371; H05K 2201/10409; H05K 2201/10356; H05K 2201/10393
USPC .................................. 361/730, 718, 752, 733
See application file for complete search history.

(56) References Cited

U.S. PATENT DOCUMENTS

| | | | | |
|---|---|---|---|---|
| 8,248,820 B2* | 8/2012 | Wu | ....................... | H05K 7/1492 361/730 |
| 8,519,275 B2* | 8/2013 | Hashimoto | .............. | H02G 3/32 174/480 |
| 8,576,569 B2* | 11/2013 | Malek | ....................... | H05K 3/32 361/730 |
| 8,710,376 B2* | 4/2014 | Malek | ................. | H04M 1/0274 174/354 |
| 2011/0228496 A1* | 9/2011 | Huang | ..................... | G06F 1/183 361/752 |

(Continued)

FOREIGN PATENT DOCUMENTS

| | | |
|---|---|---|
| JP | 59070390 U | 5/1984 |
| JP | 59161327 U | 10/1984 |

(Continued)

OTHER PUBLICATIONS

Notification of Refusal for corresponding JP Application No. 2016-152223, 11 pages, dated Aug. 7, 2018.

*Primary Examiner* — Rockshana D Chowdhury
(74) *Attorney, Agent, or Firm* — Matthew B. Dernier, Esq.

(57) ABSTRACT

An electronic apparatus includes a support member, and a cable mounted on the support member. The support member includes a first clamp portion and a second clamp portion mounting the cable on the support member. The first clamp portion includes a first portion being located at upper side of the cable and restricting upward movement of the cable. The second clamp portion is located on the lower side of the cable. At least part of an upper surface of the second clamp portion is located at a level superior to a lower surface of the first portion of the first clamp portion.

9 Claims, 5 Drawing Sheets

(56) References Cited

U.S. PATENT DOCUMENTS

| | | | |
|---|---|---|---|
| 2013/0048368 A1 | 2/2013 | Malek | |
| 2013/0141848 A1* | 6/2013 | Zhou | G11B 33/122 |
| | | | 361/679.01 |
| 2014/0168927 A1* | 6/2014 | Morris | H05K 13/00 |
| | | | 361/807 |

FOREIGN PATENT DOCUMENTS

| | | | |
|---|---|---|---|
| JP | 2006248293 A | 9/2006 | |
| JP | 2013222776 A | 10/2013 | |

* cited by examiner

ELECTRONIC APPARATUS

BACKGROUND

The present disclosure relates to disposition of a cable in an electronic apparatus.

Some electronic apparatuses such as gaming machines and personal computers have a wireless communication function. Such an electronic apparatus includes a cable for connecting an antenna with a circuit substrate. The electronic apparatus disclosed in Japanese Patent Laid-Open No. 2013-222776 includes a shield that covers a circuit substrate to thereby shield radiation (electromagnetic waves) from an integrated circuit. Part of an outer edge of the shield is folded into a groove shape that surrounds the cable. The foregoing structure enables the shield to prevent noise from occurring in a signal transmitted over the cable.

SUMMARY

When the cable is displaced from the shield in the above-described electronic apparatus, noise tends to occur more readily in the signal transmitted over the cable or the cable is more likely to interfere with another part.

It is desirable to provide an electronic apparatus that can effectively prevent a cable from being displaced from a support member such as a shield.

According to an embodiment of the present disclosure, there is provided an electronic apparatus that includes a support member and a cable mounted on the support member. The support member includes a first clamp portion and a second clamp portion attaching the cable in the support member. The first clamp portion includes a first portion that is located at upper side of the cable and that restricts upward movement of the cable. The second clamp portion is located on the lower side of the cable. At least part of an upper surface of the second clamp portion is located at a level superior to a lower surface of the first portion of the first clamp portion.

The electronic apparatus according to an embodiment of the present disclosure can effectively prevent the cable from being displaced from the support member.

DETAILED DESCRIPTION OF THE PREFERRED EMBODIMENT

Figure 1:
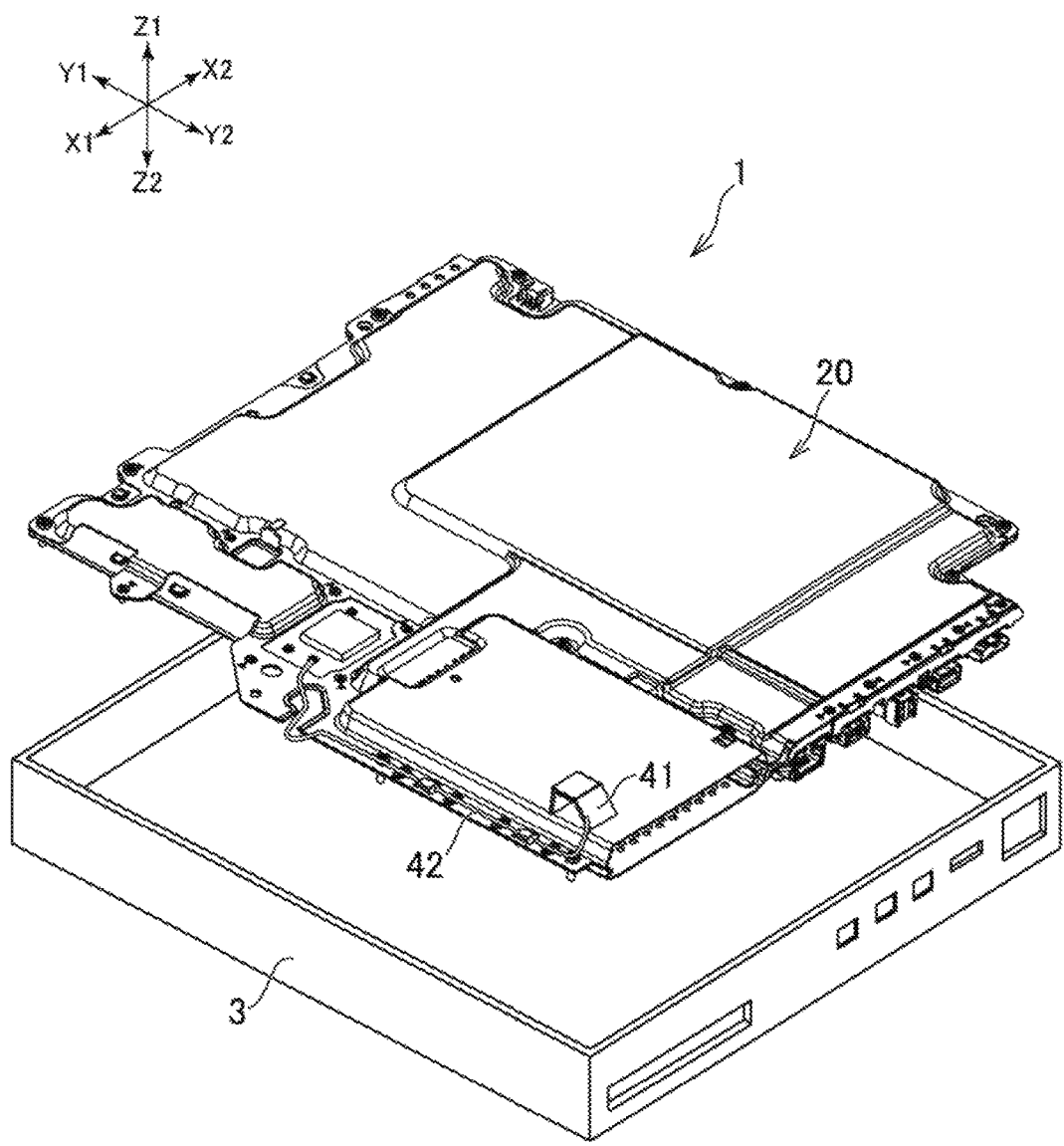
FIG. 1 is an exploded perspective view of an electronic apparatus according to an embodiment of the present disclosure, in which the electronic apparatus is viewed from an obliquely rear side and in which a cover for covering components included in the electronic apparatus is removed.
Figure 2:
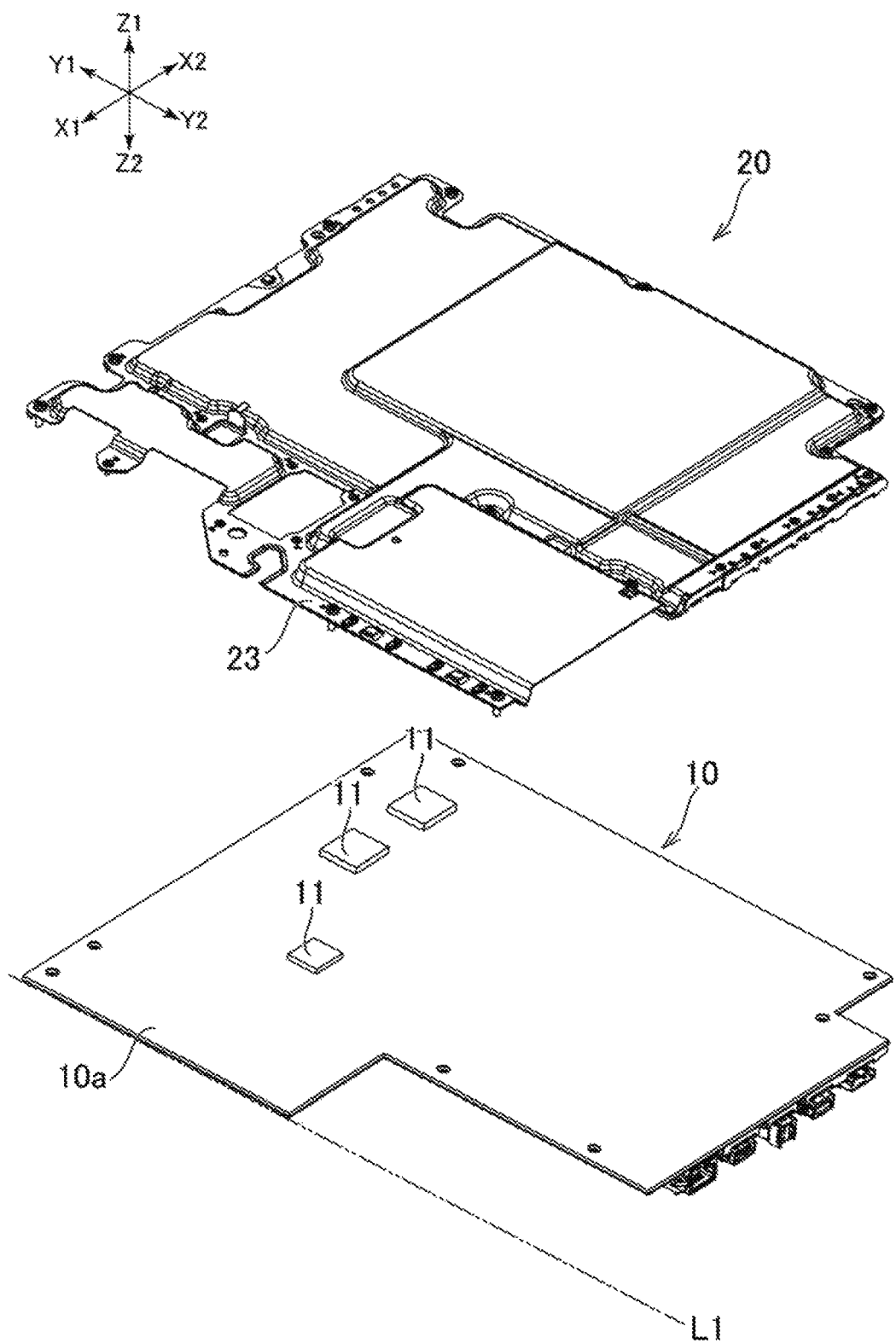
FIG. 2 is an exploded view of a circuit substrate and a first shield.
Figure 3:
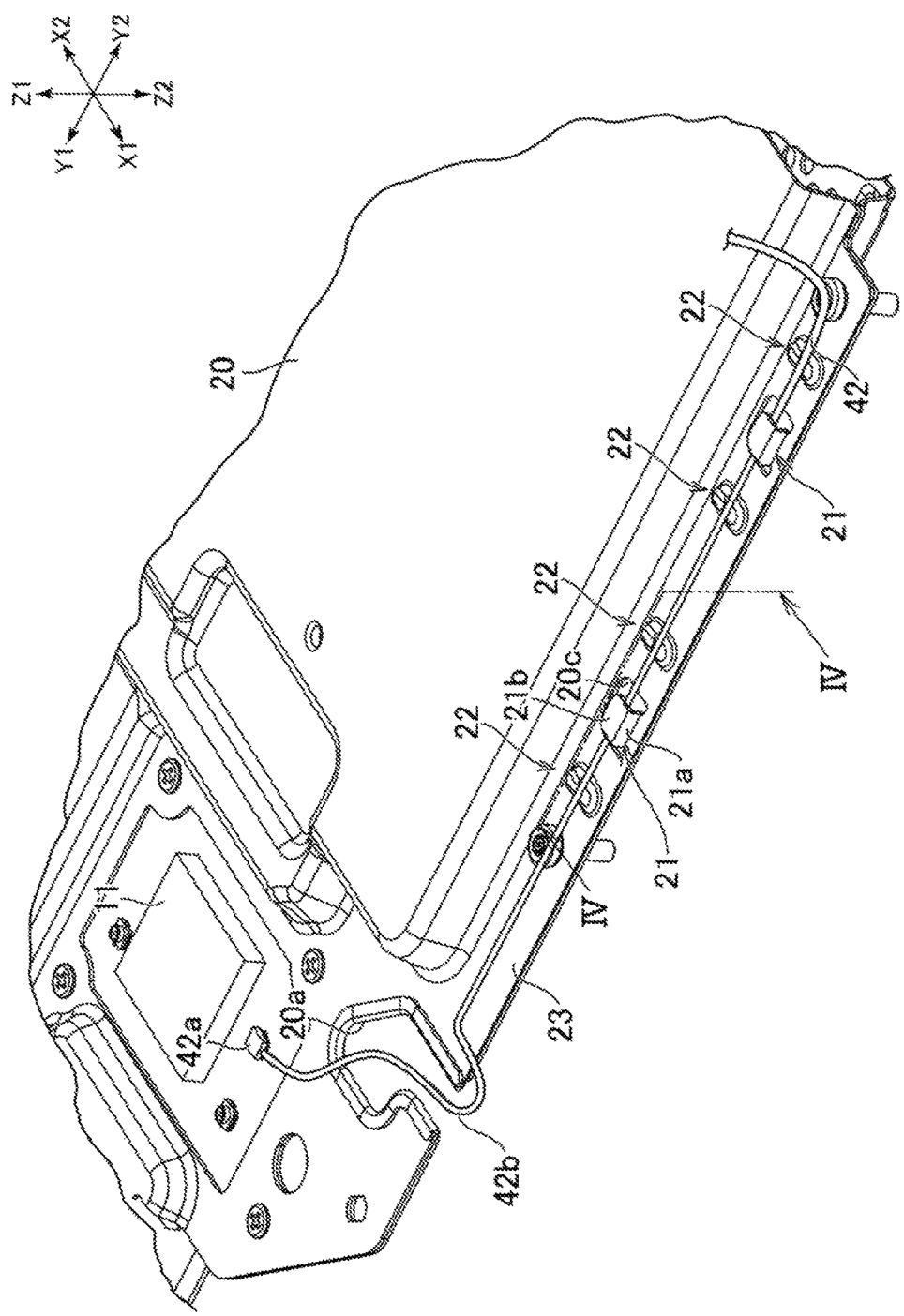
FIG. 3 is an enlarged view of main components shown in FIG. 1.
Figure 4:
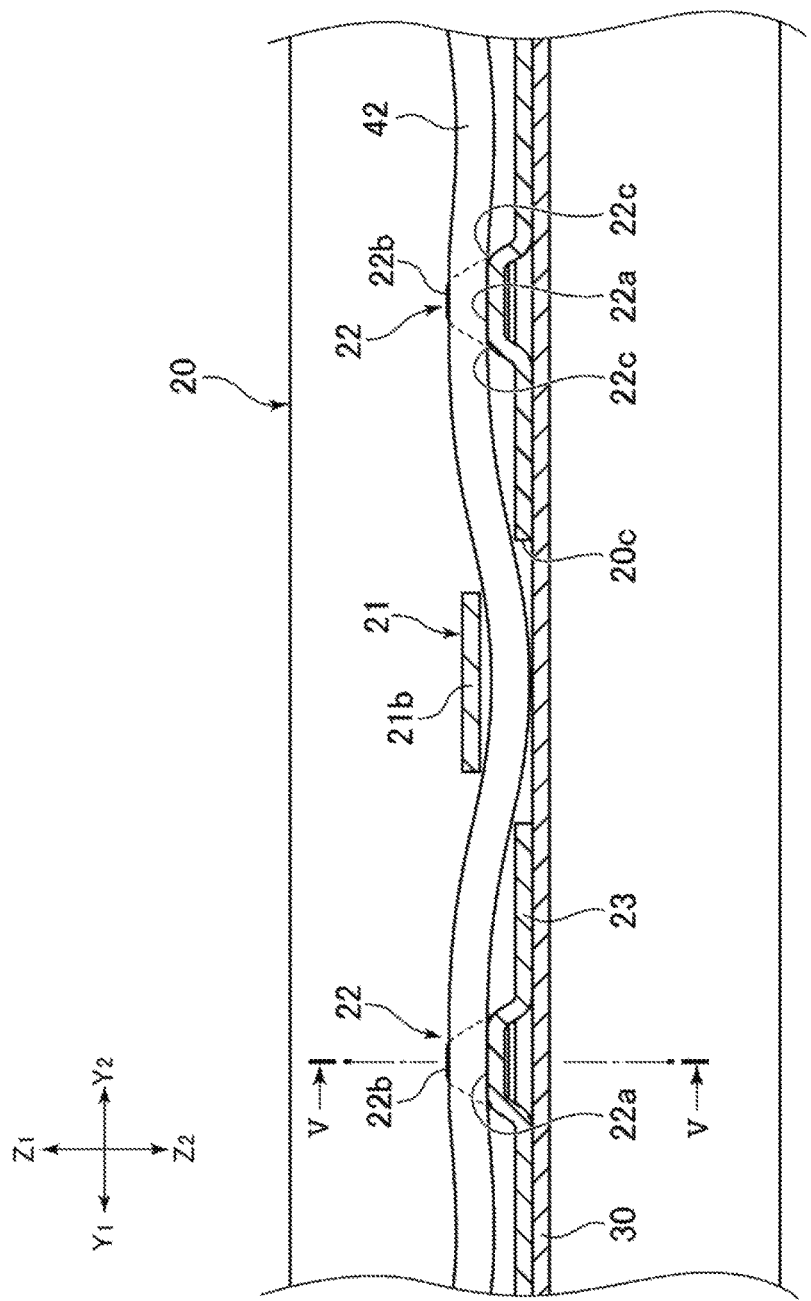
FIG. 4 is a cross-sectional view taken along line IV-IV in FIG. 3.
Figure 5:
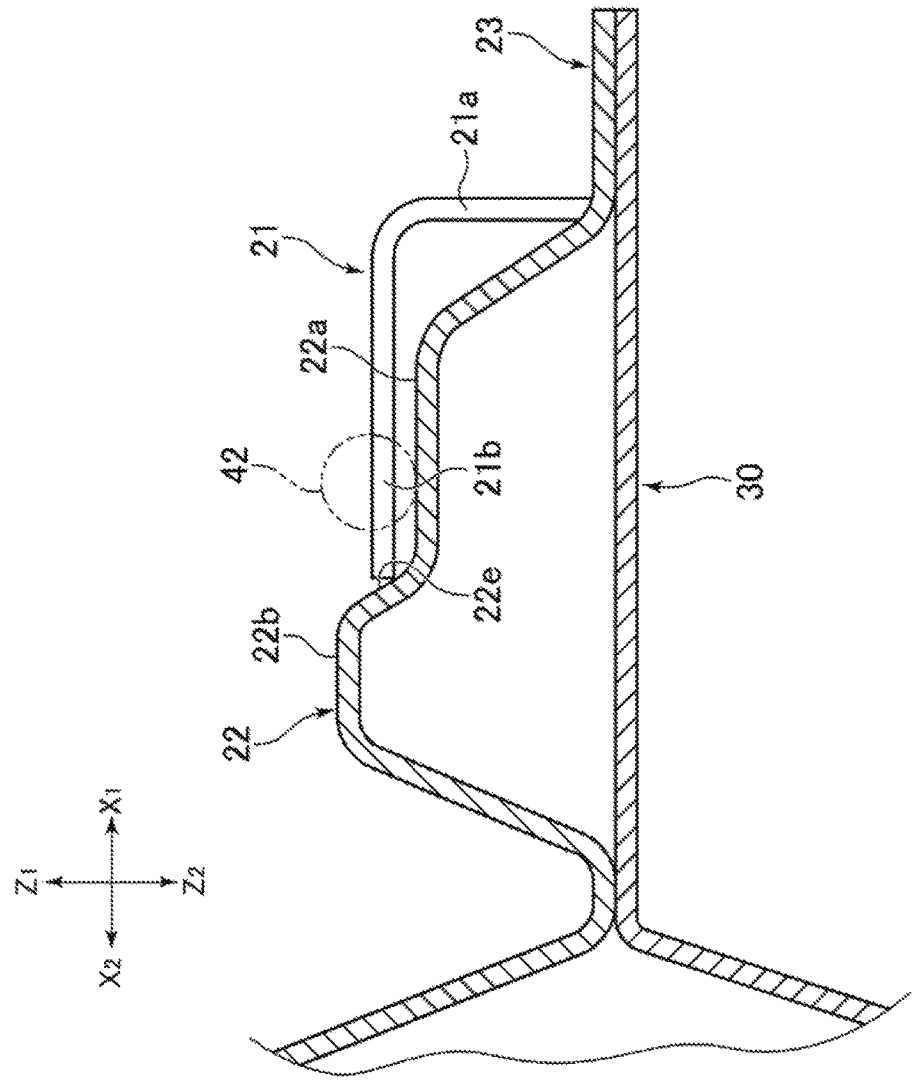
FIG. 5 is a cross-sectional view of the first shield, taken along line V-V in FIG. 4.

An embodiment of the present disclosure will be described below. FIG. 1 is an exploded perspective view of an electronic apparatus 1 according to an embodiment of the present disclosure. FIG. 1 shows the electronic apparatus 1 from which a cover for covering components included in the electronic apparatus 1 has been removed. FIG. 2 is an exploded view of a circuit substrate 10 and a first shield 20. FIG. 3 is an enlarged view of main components shown in FIG. 1. FIG. 4 is a cross-sectional view taken along line IV-IV in FIG. 3. FIG. 5 is a cross-sectional view of the first shield 20, taken along line V-V in FIG. 4.

In the descriptions that follow, arrows X1 and X2 shown in FIG. 1 represent rightward and leftward directions, respectively, arrows Y1 and Y2 shown in FIG. 1 represent anterior and posterior directions, respectively, and arrows Z1 and Z2 shown in FIG. 1 represent superior and inferior directions, respectively. In the present specification, the direction in which a cable 42 is disposed with respect to the first shield 20 is defined as the superior/upper direction. In the electronic apparatus 1, the cable 42 may be disposed at lower side of the first shield 20. Specifically, relative positions of the cable 42, the first shield 20, the circuit substrate 10, and other parts shown in FIGS. 1 to 5 may be turned upside down in the superior-inferior direction.

The electronic apparatus 1 is, for example, an entertainment apparatus that functions as a gaming machine or an audio-visual device. The electronic apparatus 1 outputs to a display device such as a television set moving image data generated through execution of a game program, image and audio data acquired from a recording medium such as an optical disc, and/or image and audio data acquired over a network. The electronic apparatus 1 is not limited to the entertainment apparatus such as the gaming machine, but may be a personal computer.

Reference is made to FIG. 2. The electronic apparatus 1 includes the circuit substrate 10 on which a plurality of integrated circuits 11 that function as, for example, a central processing unit (CPU), a graphics processing unit (GPU), and a memory are mounted. The first shield 20 covers a first surface (a superior surface in the example of the electronic apparatus 1) of the circuit substrate 10. The first shield 20 may cover generally the circuit substrate 10 or partially, for example, only a portion of the circuit substrate 10 in which the integrated circuits 11 are disposed. The first shield 20 is a plate-shaped member formed of metal and shields electromagnetic waves from the integrated circuits 11.

The electronic apparatus 1 includes an exterior member in which the circuit substrate 10, the first shield 20, and other parts are housed. As shown in FIG. 1, the electronic apparatus 1 exemplarily includes a housing 3 as the exterior member. The housing 3 is formed of, for example, a resin. The housing 3 may be integrally molded from a resin or may combine a plurality of parts together.

As shown in FIG. 1, the electronic apparatus 1 includes an antenna 41 and the cable 42 that connects the antenna 41 with the circuit substrate 10. The antenna 41 represents an antenna that is applicable to wireless communication complying with, for example, the Bluetooth (registered trademark) standard or the Institute of Electrical and Electronics Engineers (IEEE)802.11 standard. The cable 42 is, for example, a coaxial cable. In the electronic apparatus 1, the antenna 41 is exemplarily disposed in a rear portion in the electronic apparatus 1. The cable 42 extends in the anterior direction from the antenna 41. As shown in FIG. 3, the cable 42 includes a terminal portion 42a disposed at a first end thereof. The terminal portion 42a is connected with a connector mounted on the circuit substrate 10. The position at which the antenna 41 is disposed in the electronic apparatus 1 is illustrative only and may be changed as appropriate.

Reference is made to FIG. 3. The cable 42 is located on an upper side of the first shield 20 (the first shield 20 corresponds to a "support member" in "WHAT IS CLAIMED IS"). The first shield 20 includes a first clamp portion 21 and a second clamp portion 22 for mounting the cable 42 on the first shield 20. In the electronic apparatus 1, the first shield 20 exemplarily includes a plurality of first clamp portions 21 and a plurality of second clamp portions 22. The first clamp portions 21 and the second clamp portions 22 are integrally formed with the first shield 20. Specifically, the first clamp portions 21 and the second clamp portions 22 are formed in an original metal plate of the first shield 20 through metalworking processes, including cutting, drilling, pressing, and bending.

As shown in FIG. 3, the first clamp portions 21 each have a side wall portion 21a and a superior wall portion 21b. Specifically, the side wall portion 21a extends superiorly. The superior wall portion 21b bends with respect to the side wall portion 21a. The superior wall portion 21b extends in a direction along the first shield 20 (specifically, in a horizontal direction). The superior wall portion 21b is located above the cable 42 and restricts upward movement of the cable 42. The superior wall portion 21b and the side wall portion 21a are open in a direction extending along the first shield 20, or the circuit substrate 10. In the electronic apparatus 1, the superior wall portion 21b exemplarily extends from an upper end of the side wall portion 21a to the left and the superior wall portion 21b and the side wall portion 21a are open to the left. In the electronic apparatus 1, the first clamp portions 21 are disposed on a bottom portion 23 formed on an outer edge of the first shield 20. The side wall portion 21a extends upwardly from the bottom portion 23. The first clamp portions 21 are formed by cutting out portions of the original metal plate of the first shield 20 from other portions and bending the cutout portions.

Reference is made to FIG. 4. The first shield 20 includes protrusions formed as the second clamp portions 22. The protrusions protrude upwardly. The second clamp portions 22 each have an upper surface disposed beneath the cable 42. Part of the upper surface of the second clamp portion 22 is located at a level superior to a lower surface of the superior wall portion 21b of the first clamp portion 21. The first clamp portions 21 and the second clamp portions 22 that are configured as described above can prevent the cable 42 from being displaced from the first shield 20. The second clamp portions 22 are formed by, for example, pressing an inferior surface of the original metal plate of the first shield 20 to thereby dent the portions corresponding to the positions of the second clamp portions 22.

The second clamp portions 22 are formed near the first clamp portions 21. More specifically, the second clamp portions 22 are adjacent to the first clamp portions 21. No other protrusions or dents by which the cable 42 is caught are formed between the second clamp portions 22 and the first clamp portions 21. In the electronic apparatus 1, the second clamp portions 22 each exemplarily have a width in a direction in which the cable 42 extends (anterior-posterior direction) smaller than a width of each of the first clamp portions 21 in the direction in which the cable 42 extends. Instead of the example of the electronic apparatus 1, the second clamp portions 22 each may have a width in the direction in which the cable 42 extends equal to or greater than the width of each of the first clamp portions 21 in the direction in which the cable 42 extends.

Reference is made to FIG. 5. In the electronic apparatus 1, the second clamp portion 22 exemplarily has a shoulder 22e on the upper surface thereof. Specifically, the upper surface of the second clamp portion 22 has a lower level portion 22a and a higher level portion 22b. The higher level portion 22b is disposed at a level superior to the lower level portion 22a. The cable 42 is located on the lower level portion 22a. The foregoing arrangements prevent an unnecessary force from acting from the second clamp portions 22 on the cable 42. The higher level portion 22b is disposed at a level superior to the lower surface of the superior wall portion 21b of the first clamp portion 21. This arrangement enables the shoulder 22e between the higher level portion 22b and the lower level portion 22a to minimize movement of the cable 42.

As described above, in the electronic apparatus 1, the superior wall portions 21b and the side wall portions 21a of the first clamp portions 21 are exemplarily open to the left. As shown in FIG. 5, the higher level portions 22b of the second clamp portions 22 are disposed with respect to the lower level portions 22a at a position in a direction in which the first clamp portions 21 are open (specifically, to the left). The foregoing arrangements result in the shoulders 22e between the respective higher level portions 22b and the respective lower level portions 22a of the second clamp portions 22 preventing the cable 42 from being displaced from the first clamp portions 21.

The direction in which the first clamp portions 21 are open in the electronic apparatus 1 is illustrative only and not limiting. For example, the superior wall portions 21b and the side wall portions 21a of the first clamp portions 21 may be open to the right. In this case, the higher level portions 22b of the second clamp portions 22 may be disposed to the right with respect to the lower level portions 22a. Additionally, the shape of the second clamp portions 22 in the electronic apparatus 1 is illustrative only and not limiting. For example, the second clamp portions 22 may each have two higher level portions 22b and the lower level portion 22a may be disposed between the two higher level portions 22b.

As shown in FIG. 5, in the electronic apparatus 1, the lower level portion 22a of the second clamp portion 22 is exemplarily disposed at a level inferior to the lower surface of the superior wall portion 21b of the first clamp portion 21. A difference in height between the lower level portion 22a and the lower surface of the superior wall portion 21b of the first clamp portion 21 may be smaller than a diameter of the cable 42. This arrangement can effectively prevent the movement of the cable 42. Instead of the example of the electronic apparatus 1, the difference in height between the lower level portion 22a and the lower surface of the superior wall portion 21b of the first clamp portion 21 may be greater than the diameter of the cable 42. In still another example, both the lower level portion 22a and the higher level portion 22b of the second clamp portion 22 may be disposed at a level superior to the lower surface of the superior wall portion 21b of the first clamp portion 21.

As shown in FIG. 5, in a cut surface perpendicular to the cable 42, the higher level portion 22b of the second clamp portion 22 (specifically, the shoulder 22e) is spaced away to the left from the side wall portion 21a of the first clamp portion 21. Specifically, the higher level portion 22b of the second clamp portion 22 is spaced away from the side wall portion 21a of the first clamp portion 21 in a direction in which the superior wall portion 21b of the first clamp portion 21 extends from the side wall portion 21a. This results in a space being formed between the shoulder 22e and the side wall portion 21a of the first clamp portion 21 in a direction orthogonal to (specifically, a lateral direction) the direction in which the cable 42 extends. This arrangement can prevent a force from acting in the lateral direction on the cable 42 from the first clamp portions 21 and the second clamp portions 22.

As shown in FIG. 4, the lower level portion 22a of the second clamp portion 22 is flat. In addition, the upper surface of the second clamp portion 22 has a curved surface portion 22c formed on an outer peripheral portion of the lower level portion 22a. The curved surface portion 22c is curved to extend downwardly. The curved surface portion 22c protects an outer peripheral surface of the cable 42. The curved surface portion 22c may be formed only on the side of the lower level portion 22a adjacent to the first clamp portion 21.

As described above, in the electronic apparatus 1, the first shield 20 exemplarily includes the plurality of first clamp portions 21 and the plurality of second clamp portions 22. One first clamp portion 21 is disposed between two adjacent second clamp portions 22. The first clamp portion 21 and the second clamp portions 22 are arranged linearly. In the electronic apparatus 1, assuming that the two adjacent second clamp portions 22 and the one first clamp portion 21 disposed between the two adjacent second clamp portions 22 form one group, the first shield 20 includes a plurality of groups.

Instead of the example of the electronic apparatus 1, one second clamp portion 22 may be formed between two adjacent first clamp portions 21. Assuming that two adjacent first clamp portions 21 and the second clamp portion 22 disposed between the two adjacent first clamp portions 21 form one group, the first shield 20 may include a plurality of groups. In still another example, the first shield 20 may include only two second clamp portions 22 and one first clamp portion 21 disposed between the two second clamp portions 22. In a further example, the first shield 20 may even include only two first clamp portions 21 and one second clamp portion 22 disposed between the two first clamp portions 21. In a still further example, the first shield 20 may include one first clamp portion 21 and one second clamp portion 22 only.

Reference is made to FIGS. 4 and 5. The electronic apparatus 1 includes a second shield 30 (see FIG. 4) that covers a second surface (an inferior surface in the example of the electronic apparatus 1) of the circuit substrate 10. The second shield 30 is also formed of a metal plate. In the electronic apparatus 1, the circuit substrate 10 exemplarily has a rectangular shape from which part has been cut away (see FIG. 2). Thus, the circuit substrate 10 is not shown in FIG. 4 or FIG. 5.

As shown in FIG. 3, the first shield 20 has the bottom portion 23. The bottom portion 23 is disposed at a position inferior to other portions of the first shield 20, specifically, portions covering the electronic components including the integrated circuits 11. The bottom portion 23 is in contact with the second shield 30. The first clamp portions 21 and the second clamp portions 22 are formed on the bottom portion 23. This arrangement prevents the cable 42 from contacting other parts disposed superior to the first shield 20. When, for example, an optical disc drive, a power unit, or any other part is disposed superior to the first shield 20, the cable 42 can be prevented from contacting any of these parts. Additionally, in the electronic apparatus 1, the first clamp portions 21 are exemplarily formed by cutting out portions of the original metal plate of the first shield 20 from other portions and bending the cutout portions. As a result, as shown in FIG. 3, openings 20c are disposed inferior to the first clamp portions 21. The openings 20c are closed by the second shield 30.

In the electronic apparatus 1, the circuit substrate 10 exemplarily has a rectangular shape from which part has been cut away as shown in FIG. 2. The bottom portion 23, being disposed in the cutaway area, is in contact with the second shield 30. The position at which the bottom portion 23 is to be disposed is illustrative only and not limiting. Specifically, the bottom portion 23 may be formed in an area in which the circuit substrate 10 exists between the first shield 20 and the second shield 30. In this case, the bottom portion 23 may contact the circuit substrate 10 instead of the second shield 30 and the first clamp portion 21 and the second clamp portion 22 may be formed on this bottom portion 23.

In the electronic apparatus 1, the bottom portion 23 of the first shield 20 is exemplarily formed on the outer edge of the first shield 20. This arrangement readily provides a distance between the integrated circuits 11 mounted on the circuit substrate 10 and the cable 42. As a result, occurrence of noise in the signal transmitted over the cable 42 can be effectively reduced.

The circuit substrate 10 has an outer edge that extends along a direction in which the outer edge of the first shield 20 on which the bottom portion 23 is formed extends. In the electronic apparatus 1, the bottom portion 23 is exemplarily formed on the right edge of the first shield 20 and the circuit substrate 10 exemplarily has a right edge 10a (see FIG. 2) that extends in a direction along the right edge of the first shield 20. In a plan view of the electronic apparatus 1, the first clamp portions 21 and the second clamp portions 22 are disposed inside a straight line L1 (see FIG. 2) that passes through the right edge 10a of the circuit substrate 10. To state the foregoing differently, the first clamp portions 21 and the second clamp portions 22 are disposed to the left of the straight line L1. This configuration allows the electronic apparatus to be built more compactly than, for example, a configuration in which the first clamp portions 21 and the second clamp portions 22 are disposed outside the straight line L1.

The positions at which the first clamp portions 21 and the second clamp portions 22 are formed are not limited to the bottom portion 23. For example, the first clamp portions 21 and the second clamp portions 22 may be formed on a portion that covers the components mounted on the circuit substrate 10.

Part of the cable 42 may be attached to a part different from the first shield 20. In the electronic apparatus 1, as shown in FIG. 3, the cable 42 exemplarily includes a curved portion 42b disposed in a portion thereof held between the terminal portion 42a and the first clamp portions 21 and the second clamp portions 22. The curved portion 42b curves severely. The curved portion 42b may be hooked onto, for example, a hook (not shown) formed in the housing 3. In the electronic apparatus 1, the first shield 20 exemplarily has a cutout 20a in the outer edge thereof. The curved portion 42b of the cable 42 is routed through the cutout 20a to extend toward the connector on the circuit substrate 10. The cable 42 may not be required to include the curved portion 42b. Specifically, the cable 42 may be positioned only by the first clamp portions 21 and the second clamp portions 22 formed of the first shield 20.

As described heretofore, the first shield 20 includes the first clamp portions 21 and the second clamp portions 22 for attaching the cable 42 to the first shield 20. Assume the direction in which the first shield 20 is disposed with respect to the circuit substrate 10 is defined to be superior. Then, the cable 42 is mounted on the first shield 20 and the first clamp portions 21 each include the superior wall portion 21b that is located on the cable 42 and that restricts upward movement of the cable 42. The second clamp portions 22 each have the superior surface disposed inferior to the cable 42.

At least part of the upper surface of the second clamp portion 22 is located at a level superior to the lower surface of the superior wall portion 21b of the first clamp portion 21. The foregoing arrangements prevent the cable 42 from being displaced from the first shield 20.

It should be noted that the present disclosure is not limited to the above-described embodiment and may include various modifications.

For example, the upper surface of the second clamp portion 22 may not be required to have the shoulder 22e. Specifically, the second clamp portion 22 may not be required to include the lower level portion 22a. In this case, the upper surface of the second clamp portion 22 may generally be disposed at a level superior to the lower surface of the superior wall portion 21b of the first clamp portion 21.

The cable 42 may not be required to connect the antenna 41 with the circuit substrate 10. Specifically, the cable 42 may connect a part (e.g., power unit) different from the antenna 41 with the circuit substrate 10.

Additionally, the first shield 20 may cover the inferior surface of the circuit substrate 10. In this case, too, when the direction in which the first shield 20 is disposed with respect to the circuit substrate 10 is defined to be superior/upper and when the positional relations described in the present specification among the parts (e.g., the cable 42, the first shield 20, and the circuit substrate 10) and the portions (e.g., the superior wall portion 21b of the first clamp portion 21, the higher level portion 22b of the second clamp portion 22, and the lower level portion 22a of the second clamp portion 22) hold, such a modification is included in the scope of the present disclosure.

The electronic apparatus 1 includes the first shield 20 as a support member. If the housing of the electronic apparatus is formed of, for example, metal, however, the first clamp portions 21 and the second clamp portions 22 may be formed in the housing. Even when the housing of the electronic apparatus is formed of resin, the first clamp portions 21 and the second clamp portions 22 may still be formed in the housing.

The present disclosure contains subject matter related to that disclosed in Japanese Priority Patent Application JP 2016-152223 filed in the Japan Patent Office on Aug. 2, 2016, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic apparatus comprising:
   a support member; and
   a cable mounted on the support member, the cable including an upper side and a lower side, wherein:
   the support member includes a first clamp portion and a second clamp portion mounting the cable on the support member,
   the first clamp portion includes a first portion being located at the upper side of the cable, the first portion extending in a cantilevered fashion from a side wall portion in a first direction, and the first portion including a lower surface engaging the upper side of the cable and restricting upward movement of the cable,
   the second clamp portion is located such that at least a lower level portion of an upper surface thereof is spaced away from the lower surface of the first portion of the first clamp portion, and engages the lower side of the cable, and such that a shoulder transitioning from the lower level portion to an upper level portion of the upper surface of the second clamp portion faces in a second direction towards the cable, and where the second direction is opposite to the first direction,
   at least the upper level portion of the upper surface of the second clamp portion being is located at a level superior to the lower surface of the first portion of the first clamp portion,
   the upper surface of the second clamp portion includes the lower level portion disposed inferior to the cable and the upper level portion disposed at a level superior to the lower level portion and superior to the first portion of the first clamp portion,
   the shoulder is located between the upper level portion and the lower level portion of the second clamp portion and transverse to the first portion of the first clamp,
   a spacing between the lower level portion of the second clamp and the lower surface of the first portion of the first clamp portion is smaller than a diameter of the cable.

2. The electronic apparatus according to claim 1, wherein
   the first clamp portion includes a second portion extending upwardly from the support member,
   the first portion of the first clamp portion bends with respect to the second portion to extend in the first direction, and
   the upper level portion of the second clamp portion is disposed in the first direction with respect to the lower level portion.

3. The electronic apparatus according to claim 1, wherein the lower level portion of the upper surface of the second clamp portion is disposed at a level inferior to the lower surface of the first portion of the first clamp portion.

4. The electronic apparatus according to claim 1, wherein the support member includes a protrusion protruding upwardly, the protrusion assuming the second clamp portion.

5. The electronic apparatus according to claim 1, wherein
   the support member is a shield that covers at least part of a circuit substrate,
   the shield includes a portion that covers an electronic component mounted on the circuit substrate and a bottom portion disposed at a level inferior to the portion covering the electronic component, and
   the first clamp portion and the second clamp portion are disposed on the bottom portion.

6. The electronic apparatus according to claim 1, wherein
   the support member is a shield that covers at least part of a circuit substrate, and
   the first clamp portion and the second clamp portion are disposed, in a plan view of the electronic apparatus, inside a straight line that passes through an outer edge of the circuit substrate.

7. The electronic apparatus according to claim 1, wherein
   the support member includes as the second clamp portion at least two second clamp portions, and
   the first clamp portion is disposed between the at least two second clamp portions.

8. The electronic apparatus according to claim 1, wherein
   the support member includes as the first clamp portion at least two first clamp portions, and
   the second clamp portion is disposed between the at least two first clamp portions.

9. The electronic apparatus according to claim 1, wherein the support member is formed of a metal plate.

* * * * *